United States Patent
Takahashi et al.

(10) Patent No.: US 10,498,250 B2
(45) Date of Patent: Dec. 3, 2019

(54) POWER CONVERTER

(71) Applicant: DENSO CORPORATION, Kariya, Aichi-pref. (JP)

(72) Inventors: Nobuaki Takahashi, Kariya (JP); Yuya Kiuchi, Kariya (JP); Kenshiro Hida, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/002,339

(22) Filed: Jun. 7, 2018

(65) Prior Publication Data

US 2018/0358903 A1 Dec. 13, 2018

(30) Foreign Application Priority Data

Jun. 7, 2017 (JP) .................. 2017-113016

(51) Int. Cl.
*H02M 7/00* (2006.01)
*H01L 23/46* (2006.01)
(Continued)

(52) U.S. Cl.
CPC ........ *H02M 7/003* (2013.01); *H01L 23/4012* (2013.01); *H01L 23/46* (2013.01);
(Continued)

(58) Field of Classification Search
CPC . H05K 7/20927–20936; H05K 7/2039; H05K 7/20445; H05K 7/20218; H05K 7/20263; H05K 7/1432; H01L 23/473
(Continued)

(56) References Cited

U.S. PATENT DOCUMENTS 8,125,781 B2 * 2/2012 Mamitsu ............... H01L 23/473
361/702
9,300,221 B2 * 3/2016 Asako ................... H02M 7/003
(Continued)

FOREIGN PATENT DOCUMENTS

CN       103733496 B  *  4/2014  ............. H02M 1/14
JP       2012-217322 A     11/2012
JP       5845995 B2   *   1/2016

OTHER PUBLICATIONS

Kenshiro Kamata, Power Converter, Jan. 2016, Kenshiro Kamata.*
Zhizhu Yahao, The Power Conversion Apparatus, Apr. 2014, Zhizhu Yahao.*

*Primary Examiner* — Dion Ferguson
*Assistant Examiner* — Amir A Jalali
(74) *Attorney, Agent, or Firm* — Oliff PLC

(57) ABSTRACT

In a power converter, a semiconductor module incorporates therein a semiconductor element constituting a power converter circuit. A smoothing capacitor is configured to smooth a direct-current voltage applied to the semiconductor module. A pair of positive and negative busbars is configured to electrically connect the semiconductor module and the smoothing capacitor. The positive and negative busbars are arranged to face each other with a predetermined space therebetween. A discharge resistor is connected in parallel with the smoothing capacitor via the positive and negative busbars, and is configured such that an electrical charge stored in the smoothing capacitor flows through the discharge resistor as a discharge current. The positive and negative busbars are interposed between the discharge resistor and the smoothing capacitor.

12 Claims, 11 Drawing Sheets

(51) Int. Cl.
  *H01L 23/40*   (2006.01)
  *H05K 7/20*    (2006.01)
  *H05K 7/14*    (2006.01)
  *H02M 7/5387*  (2007.01)
  *H05K 5/04*    (2006.01)
  *H02P 5/74*    (2006.01)

(52) U.S. Cl.
  CPC ..... *H02M 7/5387* (2013.01); *H02M 7/53875* (2013.01); *H05K 5/04* (2013.01); *H05K 7/1432* (2013.01); *H05K 7/2089* (2013.01); *H05K 7/20927* (2013.01); *H01L 23/40* (2013.01); *H02P 5/74* (2013.01); *H02P 2201/09* (2013.01)

(58) Field of Classification Search
  USPC .................. 361/699, 701–702; 363/141; 165/80.4–80.5; 257/712–714; 174/547–548
  See application file for complete search history.

(56) References Cited

U.S. PATENT DOCUMENTS

| | | | | |
|---|---|---|---|---|
| 9,667,165 | B2* | 5/2017 | Inamura | H02M 7/003 |
| 9,693,476 | B2* | 6/2017 | Nagasawa | H05K 7/1432 |
| 9,756,755 | B2* | 9/2017 | Harada | H05K 7/1432 |
| 10,070,565 | B2* | 9/2018 | Mizuno | H05K 7/20927 |
| 2011/0249421 | A1* | 10/2011 | Matsuo | B60L 7/14 |
| | | | | 361/821 |
| 2013/0070502 | A1* | 3/2013 | Suzuki | H02M 7/003 |
| | | | | 363/131 |
| 2013/0272043 | A1* | 10/2013 | Sano | H02M 7/003 |
| | | | | 363/123 |

* cited by examiner

POWER CONVERTER

CROSS REFERENCE TO RELATED APPLICATION

This application is based on and claims the benefit of priority from Japanese Patent Application No. 2017-113016 filed on Jun. 7, 2017, the disclosure of which is incorporated in its entirety herein by reference.

TECHNICAL FIELD

The present disclosure relates to power converters each including a smoothing capacitor for smoothing a direct-current (DC) voltage into an alternating-current (AC) voltage, and a discharge resistor connected in parallel to the smoothing capacitor.

BACKGROUND

Power converters, which convert DC power into AC power and/or AC power into DC power, include semiconductor modules each having integrated therein with semiconductor elements, such as insulated gate bipolar transistors (IGBTs). The power converters also include a smoothing capacitor electrically connected to the semiconductor modules. Japanese Patent Application Publication No. 2012-217322, which will be referred to as a published patent document, is an example of such power converters.

The power converter disclosed in the published patent document, which will be referred to as a conventional power converter, performs on-off switching operations of the semiconductor elements to thereby convert DC power supplied from a DC power source into AC power. The conventional power converter also smooths the DC power supplied to the semiconductor elements using the smoothing capacitor.

The semiconductor modules and the smoothing capacitor are electrically connected to each other with a pair of positive and negative busbars. The conventional power converter also includes a discharge resistor connected in parallel to the smoothing capacitor via the positive and negative busbars. The negative busbar is connected to a ground.

That is, the conventional power converter enables electrical charge stored in the smoothing capacitor to be discharged as a discharge current via the discharge resistor to the ground.

The discharge current flowing through the discharge resistor causes the temperature of the discharge resistor to increase, resulting in heat being generated from the discharge resistor. The heat generated from the discharge resistor is conducted to the smoothing capacitor via the pair of positive and negative busbars.

Because each of the positive and negative busbars is comprised of a metal plate, each of the positive and negative busbars has a relatively high heat capacity. Even if heat generated from the discharge resistor is conducted to the pair of positive and negative busbars, the high thermal capacitance of each of the positive and negative busbars causes less increase in the temperature of the positive and negative busbars, resulting in a smaller amount of heat being conducted from the positive and negative busbars to the smoothing capacitor. The conventional power converter therefore restricts an increase in the temperature of the smoothing capacitor.

SUMMARY

There is a room for improvement in the conventional power converter for further restriction of an increase of the temperature of the smoothing capacitor. That is, heat generated from the discharge resistor can be transferred to the smoothing capacitor in three ways: heat conduction, heat convection, and heat radiation.

That is, the heat conduction shows that a first component of the heat generated from the discharge resistor is transferred to the smoothing capacitor through the pair of positive and negative busbars that directly connect between the discharge resistor and the smoothing capacitor.

Heat convection shows that a second component of the heat generated from the discharge resistor is transferred to the smoothing capacitor by air convection around the power converter.

The heat radiation shows that a third component of the heat generated from the discharge resistor is transferred to the smoothing capacitor by radiation.

Unfortunately, the conventional power converter may merely address the first component of heat transferred from the discharge resistor to the smoothing capacitor by the heat conduction, this may result in a possibility of an increase of the temperature of the smoothing capacitor due to both (1) The second component of heat transferred from the discharge resistor to the smoothing capacitor by heat convection (2) The third component of heat transferred from the discharge resistor to the smoothing capacitor by radiation In view of the circumstances set forth above, an exemplary aspect of the present disclosure seeks to provide power converters, each of which is capable of restricting an increase in the temperature of a smoothing capacitor more tightly than the conventional power converter.

According to an exemplary aspect of the present disclosure, there is provided a power converter. The power converter includes a semiconductor module incorporating therein a semiconductor element constituting a power converter circuit, and a smoothing capacitor configured to smooth a direct-current voltage applied to the semiconductor module. The power converter includes a pair of positive and negative busbars configured to electrically connect the semiconductor module and the smoothing capacitor. The positive and negative busbars are arranged to face each other with a predetermined space therebetween. The power converter includes a discharge resistor connected in parallel with the smoothing capacitor via the positive and negative busbars and configured such that an electrical charge stored in the smoothing capacitor flows through the discharge resistor as a discharge current. The positive and negative busbars are interposed between the discharge resistor and the smoothing capacitor.

This configuration enables the pair of positive and negative busbars to shield the smoothing capacitor from both a component of heat transferred from the discharge resistor by heat convection and a component of heat transferred from the discharge resistor by radiation. This enables an increase of the temperature of the smoothing capacitor module to be curbed.

In particular, the power converter is configured such that the two positive and negative busbars are arranged between the discharge resistor and the smoothing capacitor instead of a single DC busbar arranged therebetween. The two positive and negative busbars therefore more efficiently shields the smoothing capacitor from both a component of heat transferred from the discharge resistor by heat convection and a component of heat transferred from the discharge resistor by radiation.

The discharge resistor of the power converter is electrically connected to the smoothing capacitor via the positive and negative busbars. This configuration results in reduction of heat transferred from the discharge resistor to the smoothing capacitor module by heat conduction.

Specifically, because each of the positive and negative busbars has a relatively high heat capacity, when heat generated from the discharge resistor is transferred to the positive and negative busbars first, increase in the temperature of each of the positive and negative busbars suppressed, reducing heat transfer from the positive and negative busbars to the smoothing capacitor. This therefore prevents large heat flows based on the heat conduction from the discharge resistor to the smoothing capacitor via the positive and negative busbars.

To sum up, the pair of positive and negative busbars of the power converter is capable of (1) Shielding the smoothing capacitor from both heat transferred from the discharge resistor by heat convection and heat transferred from the discharge resistor by radiation (2) Restricting high heat transfer based on the heat conduction from the discharge resistor to the smoothing capacitor This therefore results in efficient restriction of the temperature rise of the smoothing capacitor.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

The following describes exemplary embodiments of the present disclosure with reference to the accompanying drawings.

First Embodiment

The following describes a power converter 1 according to the first embodiment with reference to FIGS. 1 to 9.

Figure 1:
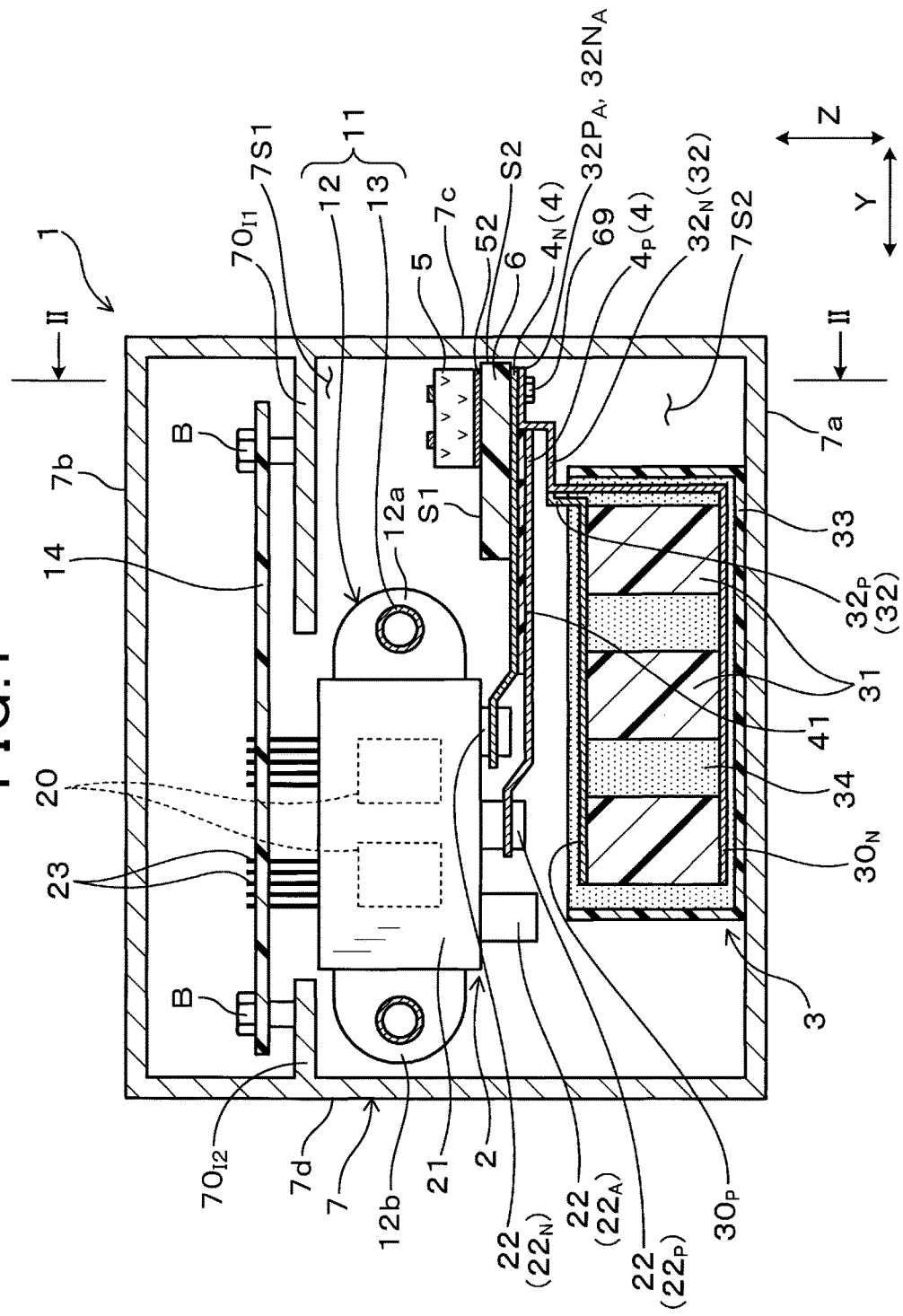
FIG. 1 is a cross-sectional view of a power converter according to the first embodiment of the present disclosure, which is taken along line I-I of FIG. 2.
Figure 9:
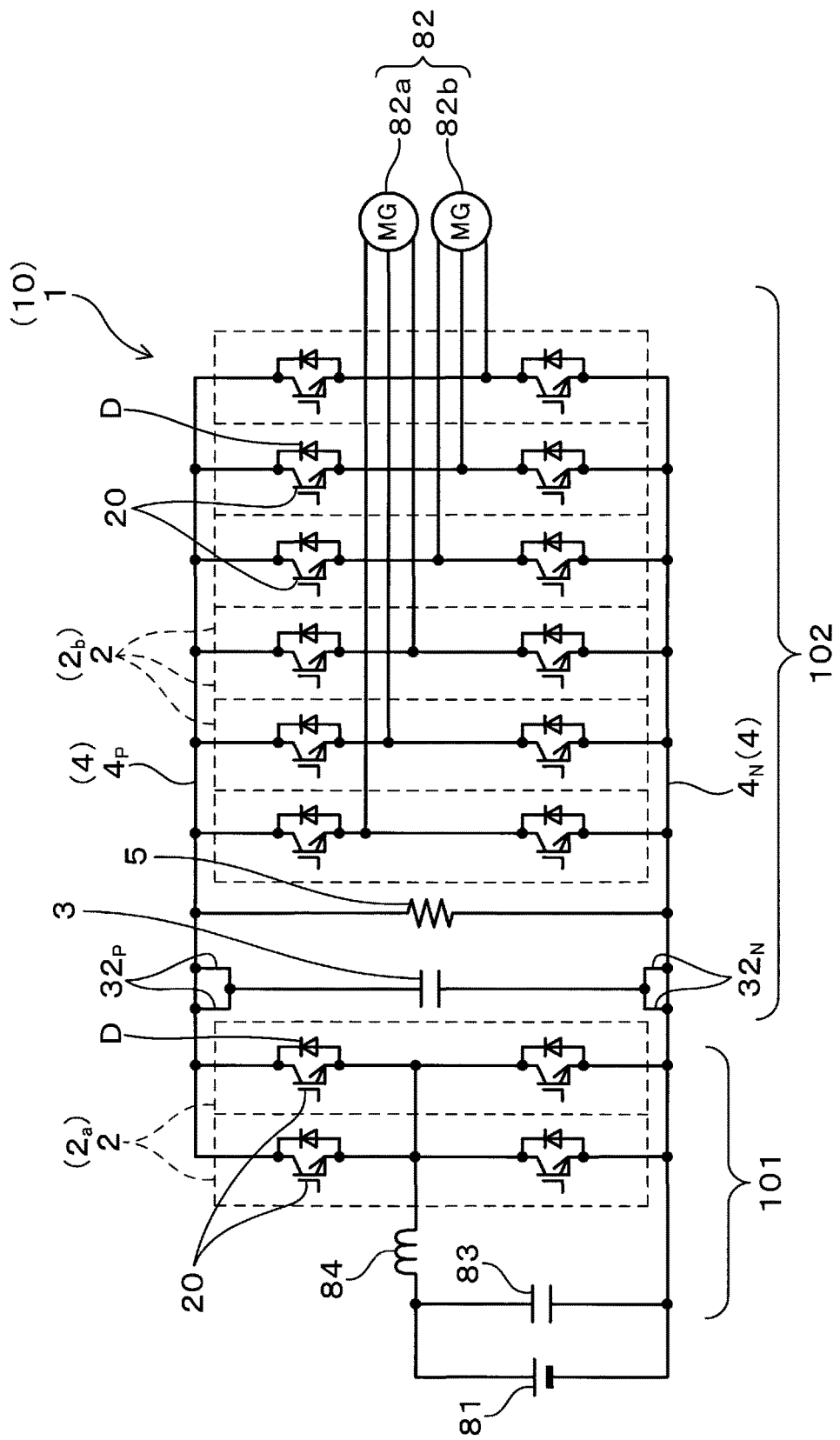
FIG. 9 is a circuit diagram of the power converter illustrated in FIG. 1.

Referring to for example FIGS. 1 and 9, the power converter 1 includes semiconductor modules 2, a smoothing capacitor module 3, a pair of DC busbars 4, and a discharge resistor 5. Each of the semiconductor modules 2 incorporates therein semiconductor elements, such as insulated gate bipolar transistors (IGBTs), 20 constituting a power converter circuit 10. The smoothing capacitor module 3 is operative to smooth a DC voltage applied to the semiconductor modules 2.

The DC busbars 4 include a positive busbar $4_P$ and a negative busbar $4_N$. The semiconductor modules 2 and the smoothing capacitor module 3 are electrically connected to each other with the positive and negative busbars $4_P$ and $4_N$. The discharge resistor 5 is connected in parallel with the smoothing capacitor module 3 via the positive and negative busbars $4_P$ and $4_N$. The negative busbar $4_N$ is connected to a ground. That is, the power converter 1 enables electrical charge stored in the smoothing capacitor module 3 to be discharged as a discharge current via the discharge resistor 5 to the ground.

Figure 2:
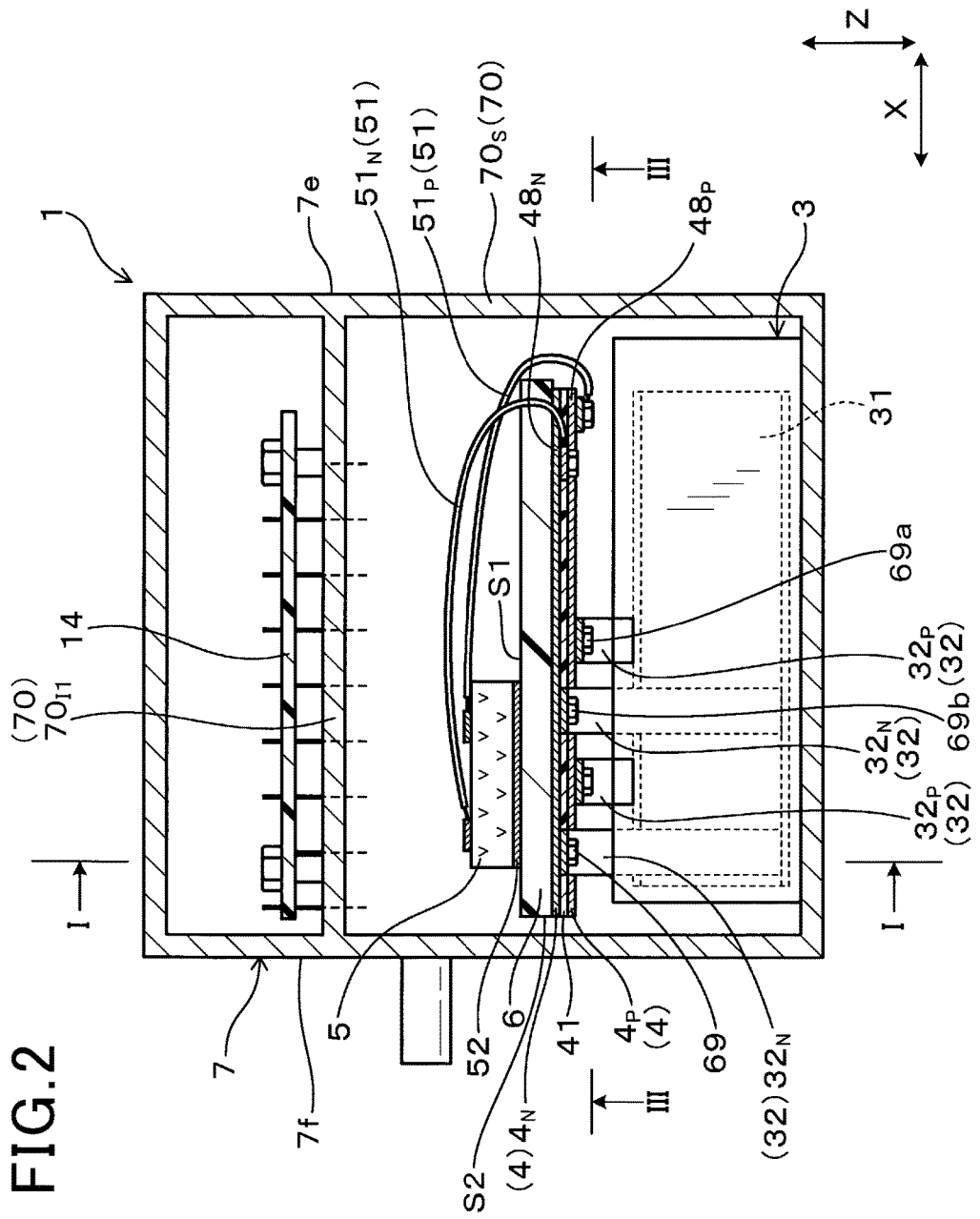
FIG. 2 is a cross-sectional view, which is taken along line II-II of FIG. 1, illustrating the power converter from which a semiconductor-module assembly has been removed.

FIGS. 1 and 2 illustrate that the positive and negative busbars $4_P$ and $4_N$ are arranged between the discharge resistor 5 and the smoothing capacitor module 3.

The power converter 1 according to the first embodiment is installed in a vehicle, such as an electrical vehicle or a hybrid vehicle.

The power converter 1 also includes a filter capacitor 83 and an inductor, i.e. a reactor, 84. The semiconductor modules 2 include two first semiconductor modules $2_a$ and second semiconductor modules $2_b$. The first semiconductor modules $2_a$, the film capacitor 83, and the inductor 84 constitute a voltage booster 101, and the second semiconductor modules $2_b$ and the smoothing capacitor module 3 constitute an inverter circuit 102.

For example, as illustrated in FIG. 9, the second semiconductor modules $2_b$ include a first set of three semiconductor modules $2_b$ and a second set of three semiconductor modules $2_b$. The first set of three semiconductor modules $2_b$ is connected to a first three-phase AC motor 82a, and the second set of three semiconductor modules $2_b$ is connected to a second three-phase AC motor 82b.

The voltage booster 101 boosts a DC voltage supplied from a DC power source 81. The first set of three semiconductor modules $2_b$ of the inverter circuit 102 converts the boosted DC voltage into an AC voltage, and supplies the AC voltage to the first three-phase AC motor 82a, thus driving the first three-phase AC motor 82a. Similarly, the second set of three semiconductor modules $2_b$ of the inverter circuit 102 converts the boosted DC voltage into an AC voltage, and supplies the AC voltage to the second three-phase AC motor 82b, thus driving the second three-phase AC motor 82b. Driving the first and second three-phase AC motors 82a and 82b cause the vehicle to travel.

Connecting the discharge resistor 5 to be parallel with the smoothing capacitor module 3 without any switches between the discharge resistor 5 and the smoothing capacitor module 3 enables electrical charge, which is stored in the smoothing capacitor module 3 while the power converter 1 is operating, to be discharged as a discharge current via the discharge resistor 5 to the ground. That is, even if the power converter 1 is shut down due to the occurrence of any malfunction in the power converter 1, the discharge resistor 5 enables electrical charge stored in the capacitor module 3 to be discharged to the ground therethrough, resulting in the voltage across the smoothing capacitor module 3 being reduced in a shorter time. This prevents an electrical shock from being delivered to users.

Referring to FIGS. 1 and 2, the power converter 1 includes a rectangular-parallel piped housing, i.e. a case, 7 made of, for example, a metal material and including an inner hollow container space. That is, the housing 7 is comprised of opposing bottom and top walls 7a and 7b, a first pair of opposing sidewalls 7c and 7d, and a second pair of opposing sidewalls 7e and 7f. That is, the housing 7 has the sidewalls 7a to 7f that constitute the housing 7.

The smoothing capacitor module 3 is disposed on the inner bottom surface of the bottom wall 7a.

Note that, as illustrated in some figures, the direction extending perpendicular to both the bottom and top walls 7a and 7b of the housing 7 is defined as a vertical direction, i.e. a Z direction, the direction extending perpendicular to the first pair of sidewalls 7c and 7d is defined as a longitudinal direction, i.e. a Y direction, and the direction extending perpendicular to the second pair of sidewalls 7e and 7f is defined as a lateral direction, i.e. an X direction.

The power converter 1 includes a rectangular plate-like mount base 6 supported by the smoothing capacitor module 3. The positive and negative busbars $4_P$ and $4_N$ are mounted to the mount base 6, and the discharge resistor 5 is also mounted to the mount base 6. In particular, the mount base 6 is interposed between the discharge resistor 5 and the positive and negative busbars $4_P$ and $4_N$.

Figure 7:
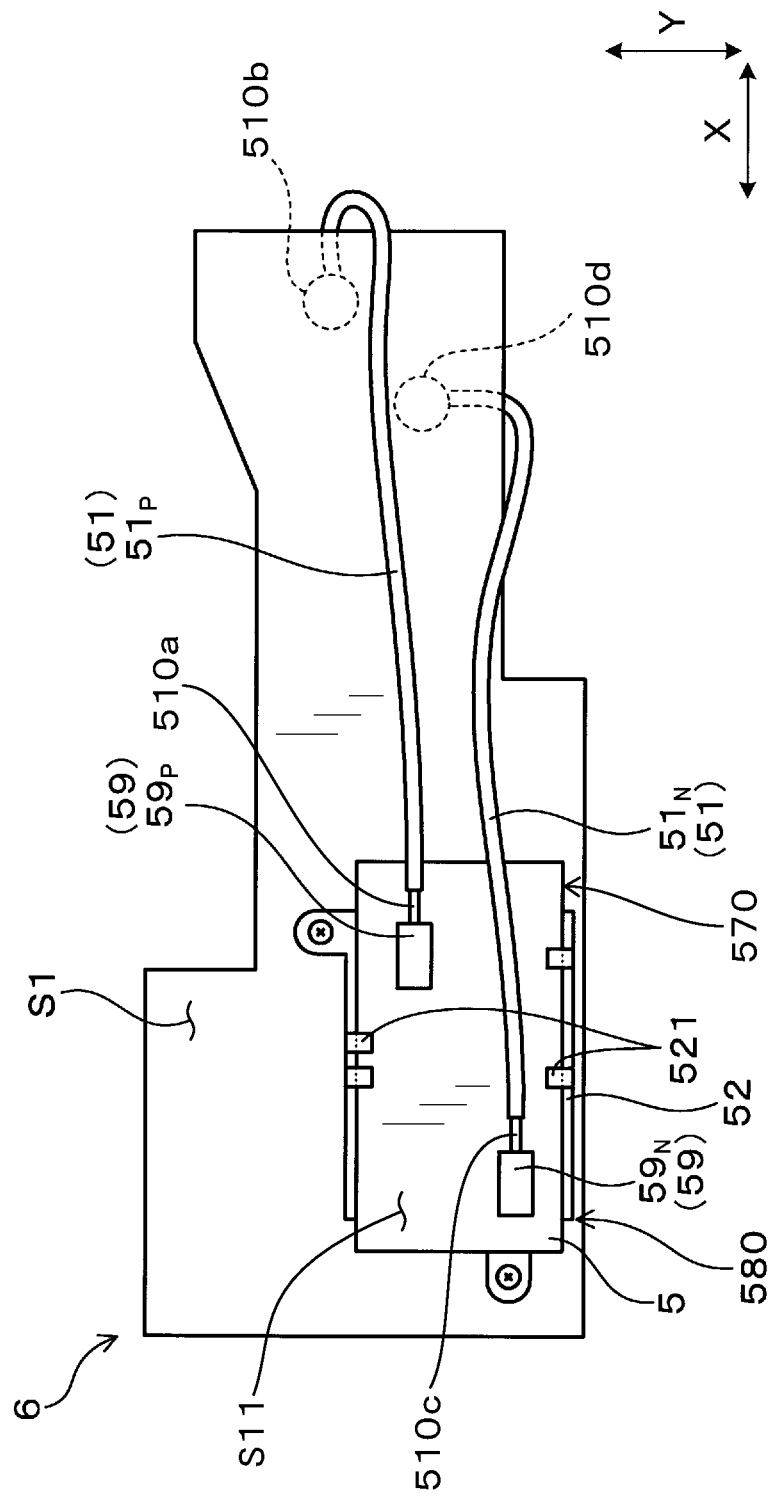
FIG. 7 is an enlarged view of a discharge resistor and the mount base.

In particular, as illustrated in FIGS. 1, 2, and 7, the mount base 6 has a first major surface S1 and a second major surface S2 opposite to the first major surface S1. The discharge resistor 5 has a substantially rectangular plate-like shape, and the power converter 1 includes a metallic plate-like bracket 52 on which the discharge resistor 5 is mounted, and the bracket 52, on which the discharge resistor 5 is mounted, is mounted on the first major surface S1 of the mount base 6.

Figure 3:
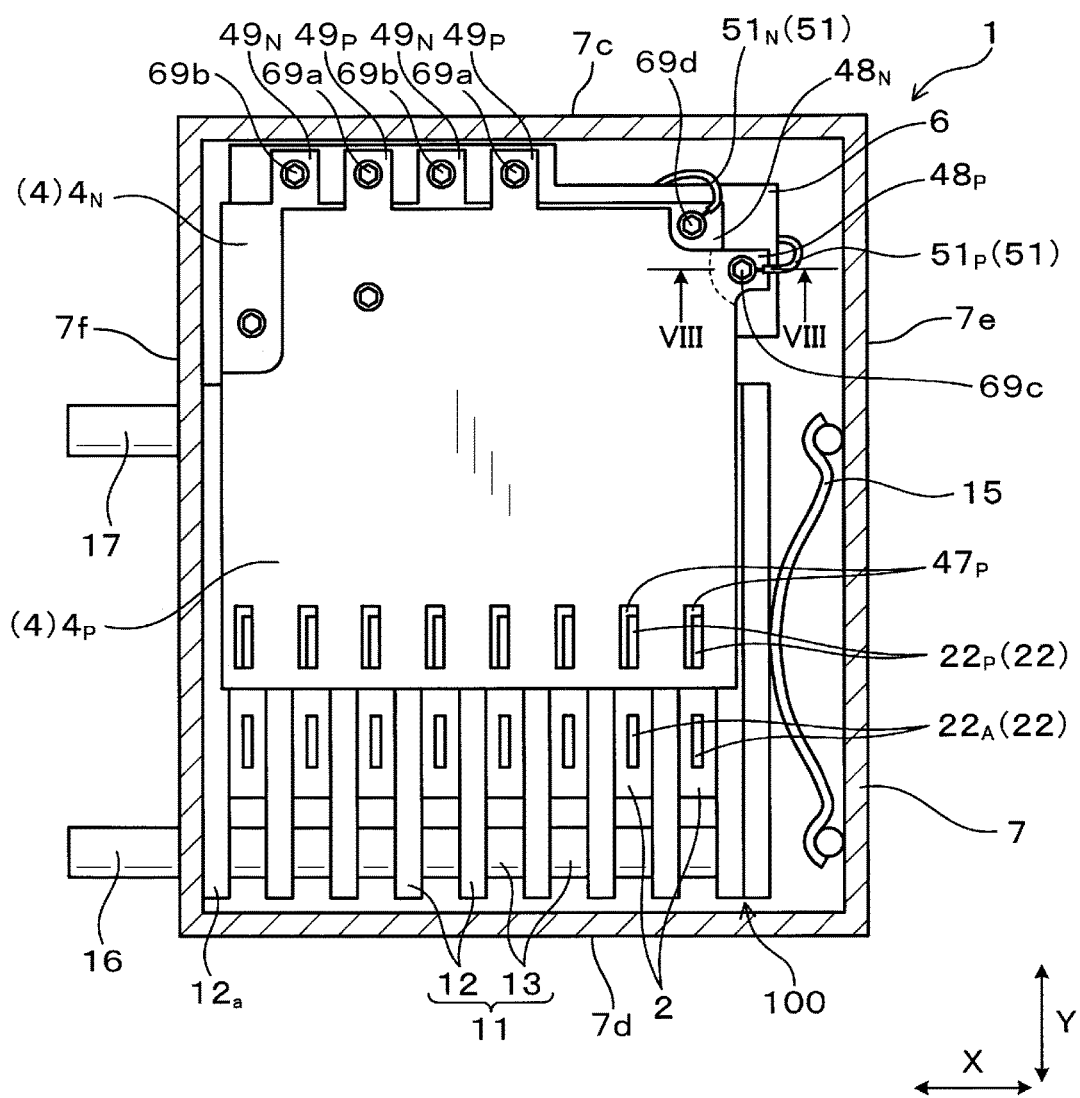
FIG. 3 is a cross-sectional view taken along line III-III of FIG. 2.
Figure 4:
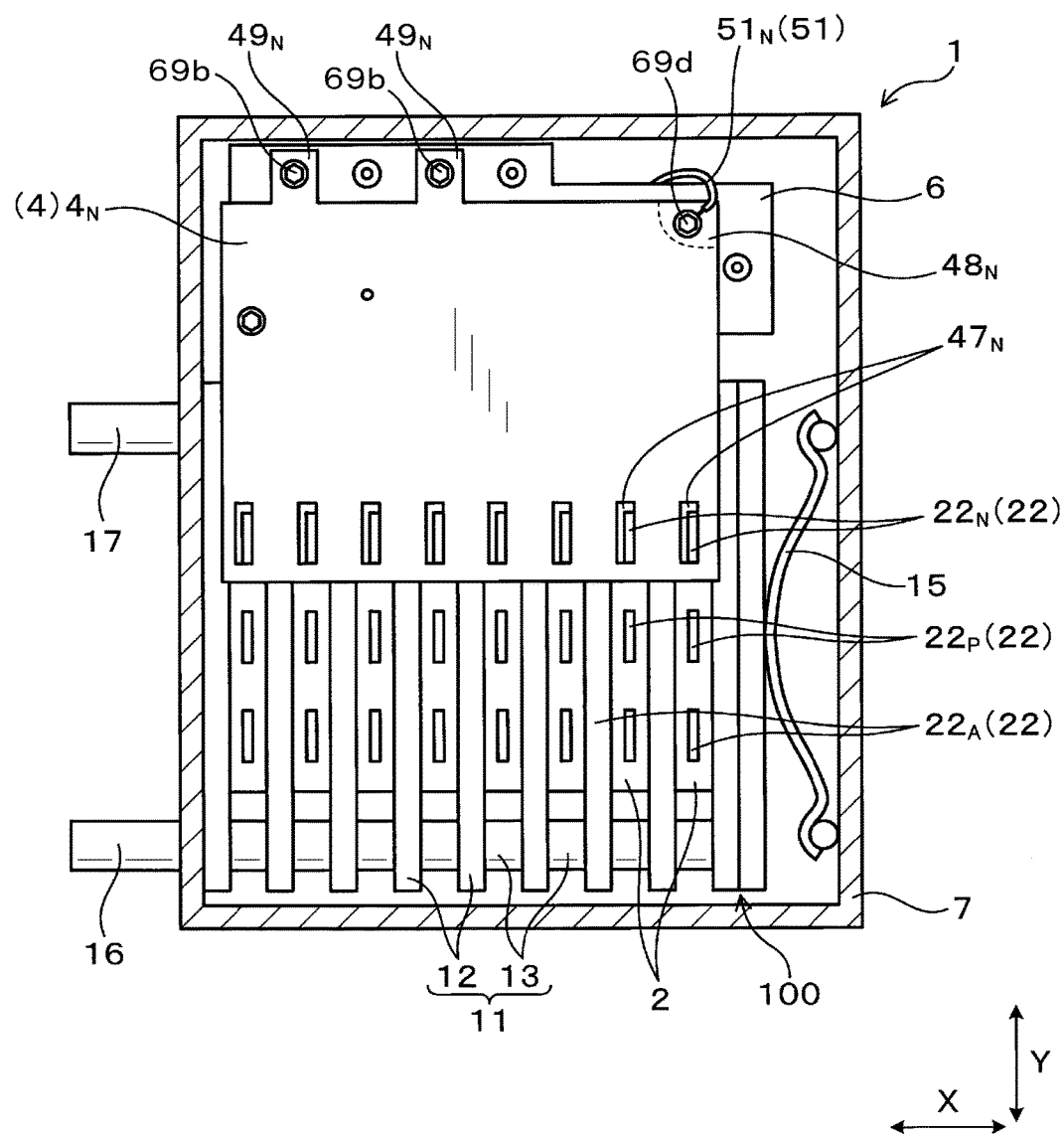
FIG. 4 is a cross-sectional view illustrating the power converter whose positive busbar has been removed from the power converter illustrated in FIG. 3.

Referring to FIGS. 3 and 4, each of the positive and negative busbars $4_P$ and $4_N$ has a substantially rectangular plate-like shape. Referring to FIGS. 1 and 2, the power converter 1 includes a substantially sheet-like insulator member 41 interposed between the positive and negative busbars $4_P$ and $4_N$. In other words, the positive and negative busbars $4_P$ and $4_N$ are respectively mounted on opposing first and second major surfaces of the insulator member 41 such that the insulator member 41 electrically isolates the positive and negative busbars $4_P$ and $4_N$ from each other. This results in the positive busbar $4_P$, the insulator member 41, and the negative busbar $4_N$ having a stack configuration. For example, an insulating paper can be used as the insulator member 41.

Referring to FIGS. 1 and 2, the smoothing capacitor module 3 is comprised of a common positive electrode $30_P$, a common negative electrode $30_N$, capacitor cells 31, positive terminals $32_P$, negative terminals $32_N$, a substantially rectangular-parallelepiped case 33, and a filler member 34. The case 33 is made of, for example, a resin material, and has an opening top wall and a bottom wall opposite to the opening top wall; the case 33 is mounted at its bottom wall on the inner surface of the bottom wall 7a of the housing 7.

For example, the smoothing capacitor module 3 according to the first embodiment is comprised of three capacitor cells 31. Each of the capacitor cells 31 has opposing first and second ends, and the common positive electrode $30_P$ is mounted on the first ends of the capacitor cells 31, and the common negative electrode $30_N$ is mounted on the second ends of the capacitor cells 31, resulting in a capacitor assembly being formed.

The capacitor assembly, which is comprised of the capacitor cells 31 interposed between the common positive and negative electrodes $30_P$ and $30_N$, is installed in the case 33 while the filler member 34 is filled in the case 33 such that the capacitor cells 31 are arranged in the Y direction (see FIG. 1).

Each of the common positive and negative electrodes $30_P$ and $30_N$ has a first side facing the sidewall 7c of the housing 7, and a second side facing the sidewall 7d of the housing 7.

Each of the positive and negative terminals 32P and 32N has a plate-like bar shape. For example, the capacitor module 3 according to the first embodiment includes two positive terminals 32P and two negative terminals 32N. Each of the positive terminals 32P has opposing first and second ends in its longitudinal direction, and the first end of the positive terminals 32P is joined to the first side of the common positive electrode 30P in the filler member 34. Similarly, each of the negative terminals 32N has opposing first and second ends in its longitudinal direction, and the first end of the negative terminals 32N is joined to the first side of the common negative electrode 30N in the filler member 34.

Each of the positive terminals $32_P$ whose first end is joined to the first side of the common positive electrode $30_P$ is partially exposed from the filler member 34 via the opening top wall of the case 33; the exposed portion of each of the positive terminals $32_P$ includes the second end thereof. Similarly, each of the negative terminals $32_N$ whose first end is joined to the common negative electrode $30_N$ in the filler member 34 is partially exposed from the filler member 34 via the opening top wall of the case 33; the exposed portion of each of the negative terminals $32_N$ includes the second end thereof.

The exposed portion of each of the positive terminals $32_P$ is configured to (1) Extend toward the top wall 7b by a predetermined length in the Z direction (2) Thereafter bend to extend toward the sidewall 7c of the housing 7 by a predetermined length in the Y direction (3) Thereafter bend to extend toward the top wall 7b by a predetermined length in the Z direction (4) Thereafter bend to extend toward the sidewall 7c of the housing 7 by a predetermined length in the Y direction That is, the second end of each of the positive terminals $32_P$ is configured as a mount edge $32_{P4}$ to which a corresponding capacitor connector portion $49_P$ of the positive busbar $4_P$ is fastened with a bolt 69a (see FIGS. 1 to 3). The positive busbar $4_P$ whose capacitor connector portions $49_P$ are fastened to the respective mount edges $32_{P4}$ of the positive terminals $32_P$ is arranged to extend in the X and Y directions to face the capacitor module 3.

In other words, the positive terminals $32_P$ of the smoothing capacitor module 3 fixedly supports the positive busbar $4_P$.

Similarly, the exposed portion of each of the negative terminals $32_N$ is configured to (1) Extend toward the top wall 7b by a predetermined length in the Z direction (2) Thereafter bend to extend toward the sidewall 7c of the housing 7 by a predetermined length in the Y direction (3) Thereafter bend to extend toward the top wall 7b by a predetermined length in the Z direction (4) Thereafter bend to extend toward the sidewall 7c of the housing 7 by a predetermined length in the Y direction That is, the second end of each of the negative terminals $32_N$ is configured as a mount edge $32_{N4}$ to which a corresponding capacitor connector portion $49_N$ of the negative busbar $4_N$ is fastened with a bolt 69b (see FIGS. 1, 2, and 4). The negative busbar $4_N$ whose capacitor connector portions $49_N$ are fastened to the respective mount edges $32_{NA}$ of the negative terminals $32_N$ is arranged to extend in the X and Y directions to face the capacitor module 3.

In other words, the negative terminals $32_N$ of the smoothing capacitor module 3 fixedly supports the negative busbar $4_N$.

Because the positive and negative busbars $4_P$ and $4_N$ and the discharge resistor 5 are mounted to the mount base 6, the positive and negative terminals $32_P$ and $32_N$ of the capacitor module 3 fixedly support the assembly comprised of the mount base 6, the positive and negative busbars $4_P$ and $4_N$, and the discharge resistor 5. The mount base 6 is also fixed to the housing 7.

Each of the semiconductor modules 2 includes a semiconductor package 21 having a rectangular-parallelepiped shape. The semiconductor package 21 has opposing top and bottom surfaces. The semiconductor package 21 is comprised of a pair of upper- and lower-arm semiconductor elements 20, such as IGBTs, and a pair of diodes D encapsulated therein; the upper- and lower-arm semiconductor elements 20 are connected in series, and each diode D is connected in antiparallel to the corresponding one of the upper- and lower-arm semiconductor elements 20 (see FIG. 9).

In particular, the series circuits of the upper- and lower-arm semiconductor elements of the respective first and second semiconductor modules $2_a$ and $2_b$ are parallely connected to each other.

Referring to FIGS. 1, 3, 4, and 5, the semiconductor modules 2 are integrated with each other to constitute a semiconductor-module assembly 100 described later, and the semiconductor-module assembly 100 is arranged above the smoothing capacitor module 3 and the positive and negative busbars $4_P$ $4_N$ in the Z direction such that the longitudinal direction of the semiconductor package 21 of each semiconductor module 2 is arranged along the Y direction.

Each of the semiconductor modules 2 also includes power terminals 22 each having a plate-like bar shape and extending downward from the bottom surface of the semiconductor package 21. The power terminals 22 include a positive power terminal $22_P$ connected to the positive busbar $4_P$, a negative power terminal $22_N$ connected to the negative busbar $4_N$, and an AC power terminal $22_A$ connected to a corresponding one of the first and second three-phase AC motors 82a and 82b (see FIG. 9).

Each of the semiconductor modules 2 further includes control terminals 23, such as gate terminals of the respective semiconductor elements 20, extending upward from the top surface of the semiconductor package 21 thereof.

The housing 7 includes attachment walls 70, which include first and second attachment walls $70_{f1}$ and $70_{f2}$ each having a rectangular plate-like shape. The first attachment wall $70_{f1}$ continuously extends from the sidewalls 7c, 7e, and 7f to be located above the discharge resistor 5; the first attachment wall $70_{f1}$ faces the discharge resistor 5. The second attachment wall $70_{f2}$ continuously extends from the sidewalls 7d, 7e, and 7f to face the first attachment wall $70_{f1}$, resulting in a space provided between the first and second attachment walls $70_{f1}$ and $70_{f2}$ in the Y direction.

The power converter 1 includes a rectangular plate-like control circuit board 14. The control circuit board 14 has a pair of first and second edges, and is arranged such that the first and second edges are located above the respective first and second attachment walls $70_{f1}$ and $70_{f2}$. The first and second edges of the control circuit board 14 are fastened to the respective first and second attachment walls $70_{f1}$ and $70_{f2}$ with bolts B. This results in the control circuit board 14 being located above the semiconductor modules 2.

In particular, the semiconductor modules 2 are arranged in the housing 7 such that the top surfaces of the semiconductor modules 2 face the space provided between the first and second attachment walls $70_{f1}$ and $70_{f2}$.

The control circuit board 14 includes a control circuit mounted thereto. The control terminals 23 extending upward from the top surface of the semiconductor package 21 of each semiconductor module 2 are connected to the control circuit of the control circuit board 14. That is, the control circuit of the control circuit board 14 controls on and off switching operations of each of the semiconductor elements 20.

Figure 5:
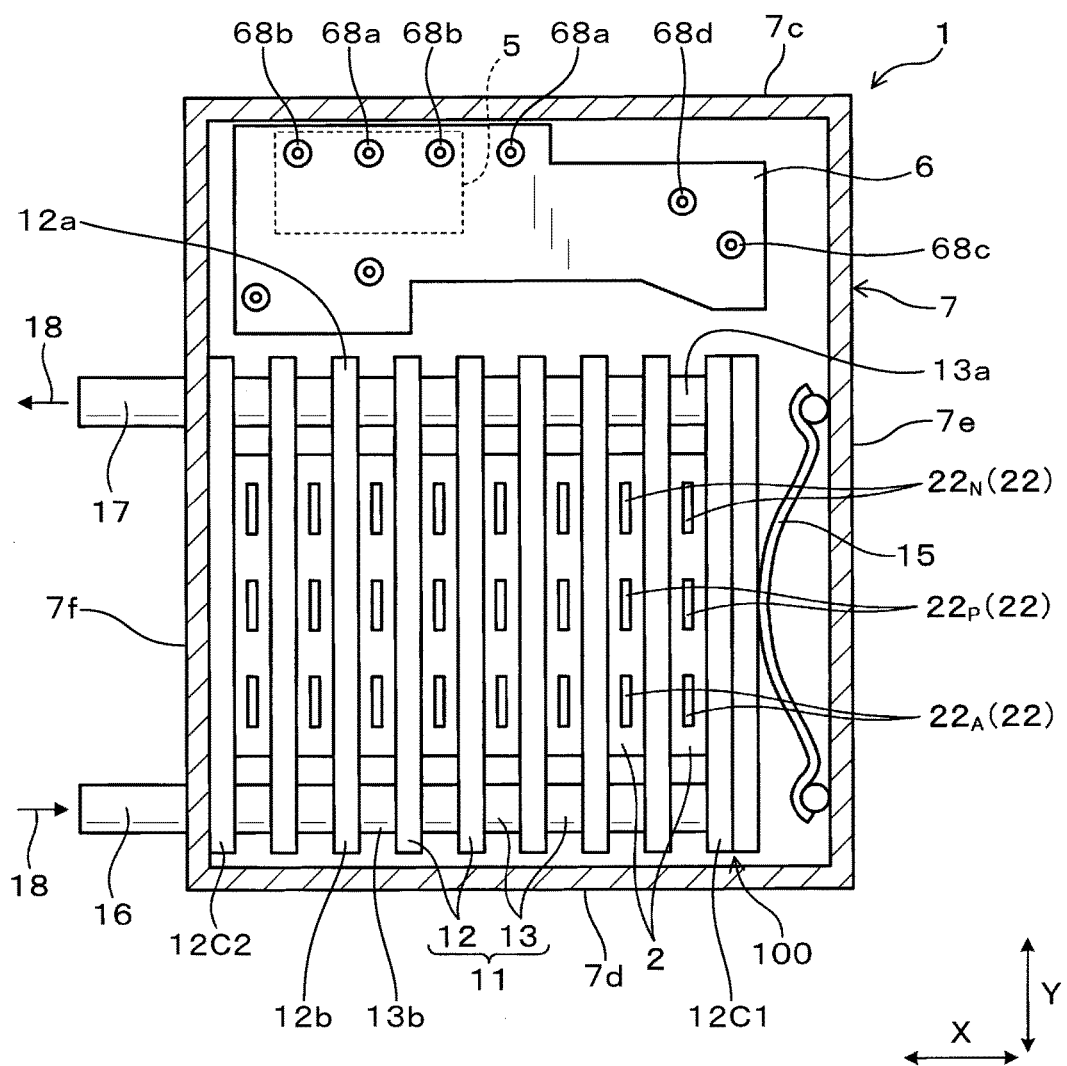
FIG. 5 is a cross-sectional view illustrating the power converter as in FIG. 4, illustrating the power converter, but with the negative busbar removed for clarity.

Referring to FIGS. 1 and 5, the power converter 1 includes a cooling mechanism 11 for cooling the semiconductor modules 2. The cooling mechanism 11 includes cooling pipes 12 and joint pipes 13 for communicably connecting the cooling pipes 12. Each of the cooling pipes 12 has a substantially rectangular plate-like shape, and has a longitudinal length in the Y direction longer than the longitudinal length of each semiconductor module 2 in the Y direction. Referring to FIGS. 1 and 5, the semiconductor modules 2 and the cooling pipes 12 are alternately arranged in the X direction to constitute the semiconductor-module assembly 100, i.e. a semiconductor-module stack 100 such that two cooling pipes 12C1 and 12C2 are located at both ends of the semiconductor-module assembly 100 in the X direction.

Each of the cooling pipes 12 has opposing first and second ends 12a and 12b in its longitudinal direction, i.e. the Y direction. The joint pipes 13 include first joint pipe 13a communicably connecting the first ends 12a of the cooling pipes 12, and second joint pipes 13b communicably connecting the second ends 12b of the cooling pipes 12. The cooling mechanism 11 is arranged such that the first ends 12a of the cooling pipes 12 are located to be closer to the discharge resistor 5 than the second ends 12b of the cooling pipes 12 are.

The semiconductor-module assembly 100 is located above the positive and negative busbars $4_P$ and $4_N$ to be close to the discharge resistor 5. In other words, the discharge resistor 5 is surrounded by the sidewalls 7c and 7f, the first attachment wall $70_{f1}$, and the first ends 12a of the cooling pipes 12 of the cooling mechanism 11.

Specifically, as illustrated in FIG. 1, the discharge resistor 5 is sandwiched between the sidewall 7c of the housing 7 and the first ends 12a of the cooling pipes 12 of the cooling mechanism 11 in the Y direction. In addition, the first attachment wall $70_{f1}$ is arranged to face the discharge resistor 5 in the Z direction, and the discharge resistor 5 is located close to the sidewall 7f of the housing 7 in the stack direction of the semiconductor modules 2 (see FIG. 5), i.e. the X direction.

Referring to FIG. 5, the power converter 1 includes an introduction pipe 16 and an exhaust pipe 17. The cooling pipe 12C2 is located to be closer to the sidewall 7f of the housing 7 than the cooling pipe 12C1 is. The cooling pipe 12C2 has opposing first and second ends; the first end of the cooling pipe 12C2 is located to be closer to the sidewall 7d than the second end of the cooling pipe 12C2 is. In particular, the cooling pipe 12C2 is in direct contact with the sidewall 7f of the housing 7.

The introduction pipe 16 airtightly penetrates through the sidewall 7f of the housing 7 to be communicably connected to the second end 12b of the cooling pipe 12C2 of the cooling mechanism 11. The exhaust pipe 17 is airtightly penetrated through the sidewall 7f of the housing 7 to be communicably connected to the first end 12a of the cooling pipe 12C2 of the cooling mechanism 11. When a predetermined refrigerant 18 is introduced into the introduction pipe 16, the refrigerant 18 flows into all the cooling pipes 12 from their second ends 12b via the second joint pipes 13b, and reaches the first ends 12a of all the cooling pipes 12. Thereafter, the refrigerant 18 flows through the first joint pipes 13a to be exhausted from the exhaust pipe 17. That is, introduction of the refrigerant 18 into the cooling pipes 12 and exhaust of the refrigerant 18 from the cooling pipes 12 are repeatedly carried out, resulting in cooling of the semiconductor modules 2.

The power converter 1 includes a pressing member 15 located between the cooling pipe 12C1 of the cooling mechanism 11 and the inner surface of the sidewall 7e of the housing 7. For example, a leaf spring is used as the pressing member 15. Specifically, the pressing member 15 elastically presses the cooling pipe 12C1 to the opposing sidewall 7f of the housing 7 in the X direction, i.e. the stack direction of the semiconductor modules 2 to thereby fixedly fasten the semiconductor-module assembly 100 to the housing 7 while ensuring contact pressure between each semiconductor module 2 and a corresponding pair of cooling pipes 12 adjacent to the semiconductor module 2.

Referring to FIG. 3, the plate-like positive busbar $4_P$ has opposing first and second ends in the Y direction; the first end faces the sidewall 7c of the housing 7, and the second end faces the sidewall 7d of the housing 7. As described above, the positive busbar $4_P$ includes the capacitor connector portions $49_P$ extending from the first end thereof toward the sidewall 7c to be fastened to the respective mount edges $32_{P4}$ of the positive terminals $32_P$ with the bolts 69a.

Similarly, the plate-like negative busbar $4_N$ has opposing first and second ends in the Y direction; the first end faces the sidewall 7c of the housing 7, and the second end faces the sidewall 7d of the housing 7. As described above, the negative busbar $4_N$ includes the capacitor connector portions $49_N$ extending from the first end thereof toward the sidewall 7c to be fastened to the respective mount edges $32_{NA}$ of the negative terminals $32_N$ with the bolts 69b.

In particular, the capacitor connector portions $49_P$ and capacitor connector portions $49_N$ are alternately arranged in the X direction, and the insulator member 41 has extending portions partially extending to be mounted on the respective capacitor connector portions $49_P$.

The positive busbar $4_P$ has opposing third and fourth ends in the X direction; the third end faces the sidewall 7e of the housing 7, and the fourth end faces the sidewall 7f of the housing 7. The negative busbar $4_N$ includes a resistor connector portion $48_N$ extending from the third end thereof toward the sidewall 7e to be electrically connected to the discharge resistor 5.

Specifically, as described later, a wire $51_P$, which has opposing first and second ends 510a and 510b, is electrically connected at the first end 510a to the discharge resistor 5, and the wire $51_P$ extends from the discharge resistor 5 to be fastened at the second end 510b to the resistor connector portion $48_P$ with a bolt 69c (see FIG. 3). This enables the discharge resistor 5 to be electrically connected to the positive busbar $4_P$.

Referring to FIG. 3, the positive busbar $4_P$ also includes through holes $47_P$ formed through the second end thereof. The through holes $47_P$ are arranged to face the respective positive power terminals $22_P$ of the semiconductor modules 2. That is, while the positive power terminals $22_P$ of the semiconductor modules 2 are fitted in the respective through hole $47_P$, the positive power terminals $22_P$ are welded to the positive busbar $4_P$.

Figure 8:
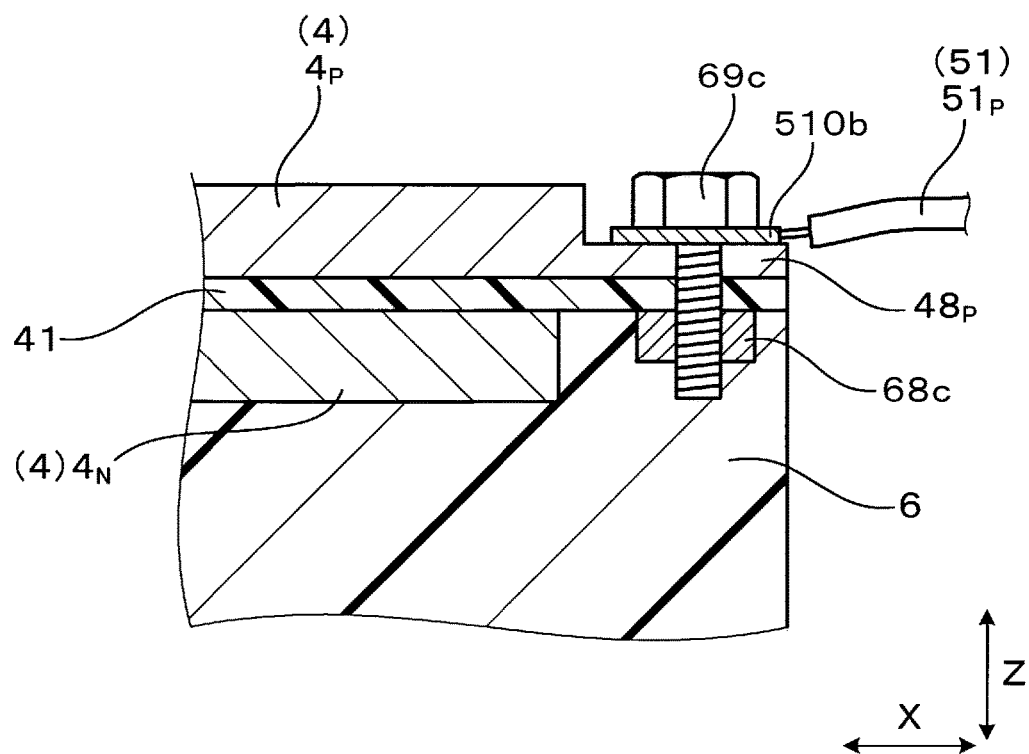
FIG. 8 is a cross-sectional view taken along line VIII-VIII of FIG. 3.

Referring to FIG. 8, the resistor connector portion $48_P$ of the positive busbar $4_P$ has a thickness in the Z direction that is thinner than a thickness of the remaining portion of the positive busbar $4_P$ in the Z direction. This enables the wire $51_P$ to be easily fastened to the resistor connector portion $48_P$ of the positive busbar $4_P$.

In addition, the resistor connector portion $48_P$ of the positive busbar $4_P$ has a thermal resistance that is higher than a thermal resistance of the remaining portion of the positive busbar $4_P$.

This impedes the transfer of heat, which has been generated from the discharge resistor 5 and transferred via the wire $51_P$, toward the smoothing capacitor module 3 via the resistor connector portion $48_P$. In particular, the second end 510b of the wire $51_P$ is shaped as a round terminal. That is, the bolt 69c, which has been inserted through the round terminal 510b of the wire $51_P$, is threadably fastened to the resistor connector portion $48_P$ of the positive busbar $4_P$ and also to the mount base 6.

Similarly, the negative busbar $4_N$ has opposing third and fourth ends in the X direction; the third end faces the sidewall 7e of the housing 7, and the fourth end faces the sidewall 7f of the housing 7. The negative busbar $4_N$ includes a resistor connector portion $48_N$ extending from the third end thereof toward the sidewall 7e to be electrically connected to the discharge resistor 5. Specifically, as described later, a wire $51_N$, which has opposing first and second ends 510c and 510d, is electrically connected at the first end 510c to the discharge resistor 5, and the wire $51_N$ extends from the discharge resistor 5 to be fastened at the second end 510d to the resistor connector portion $48_N$ with a bolt 69d (see FIG. 4). This enables the discharge resistor 5 to be electrically connected to the negative busbar $4_N$.

Referring to FIG. 4, the negative busbar $4_N$ also includes through holes $47_N$ formed through the second end thereof. The through holes $47_N$ are arranged to face the respective negative power terminals $22_N$ of the semiconductor modules 2. That is, while the negative power terminals $22_N$ of the semiconductor modules 2 are fitted in the respective through hole $47_N$, the negative power terminals $22_N$ are welded to the negative busbar $4_N$.

Like the resistor connector portion $48_P$ illustrated 9 in FIG. 8, the resistor connector portion $48_N$ of the negative busbar $4_N$ has a thickness in the Z direction that is thinner than a thickness of the remaining portion of the negative busbar $4_N$ in the Z direction. This enables the wire $51_N$ to be easily fastened to the resistor connector portion $48_N$ of the negative busbar $4_N$.

In addition, the resistor connector portion $48_N$ of the negative busbar $4_N$ has a thermal resistance that is higher than a thermal resistance of the remaining portion of the negative busbar $4_N$.

This reduces the flow of heat, generated from the discharge resistor 5, and transferred via the wire $51_N$, toward the smoothing capacitor module 3 via the resistor connector portion $48_N$. In particular, the second end 510d of the wire $51_N$ is shaped as a round terminal. That is, the bolt 69d, which has been inserted through the round terminal 510d of the wire $51_N$, is threadably fastened to the resistor connector portion $48_N$ of the negative busbar $4_N$ and also to the mount base 6.

Figure 6:
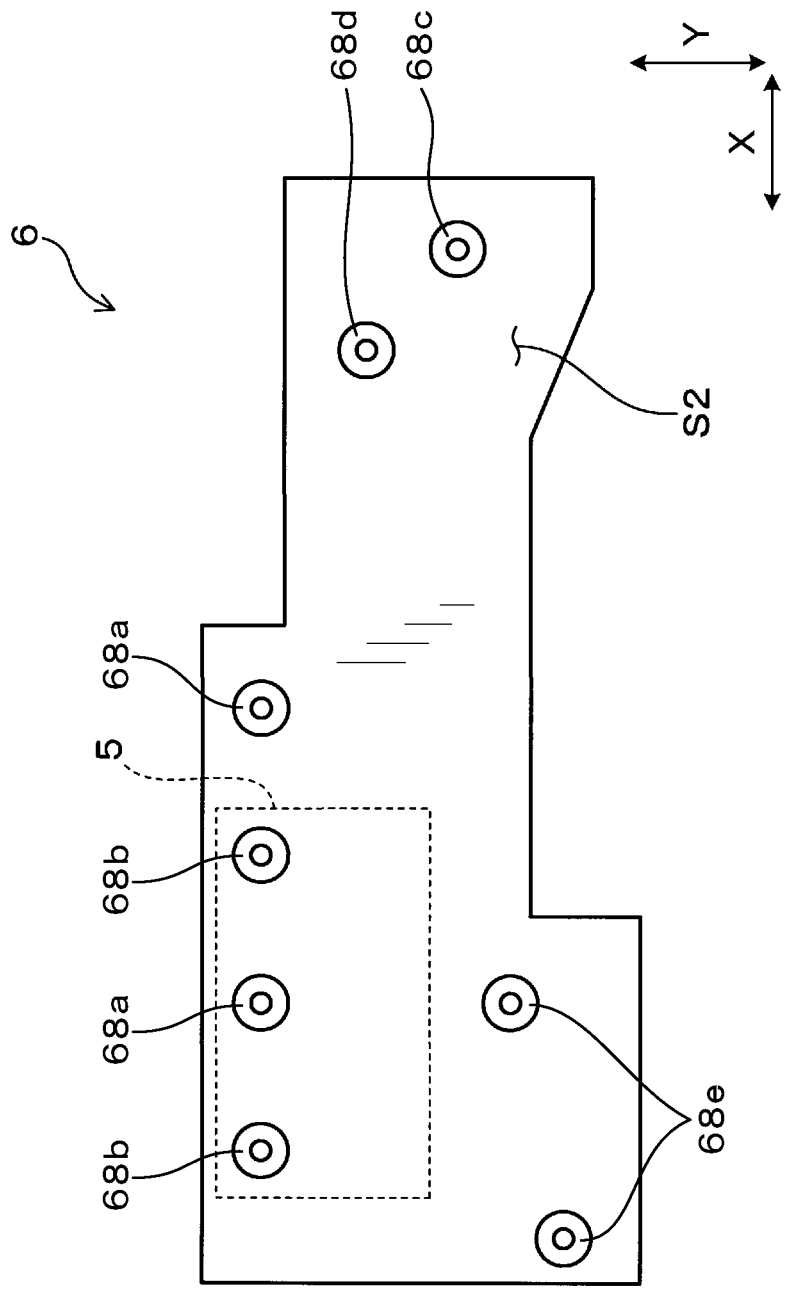
FIG. 6 is an enlarged view of a mount base while the mount base is viewed from the side of a smoothing capacitor module.

Referring to FIG. 6, insert nuts 68a are embedded in the second major surface S2 of the mount base 6 such that the insert nuts 68a face the respective capacitor connector portion $49_P$ of the positive busbar $4_P$, and insert nuts 68b are embedded in the second major surface S2 of the mount base 6 such that the nuts 68b face the respective capacitor connector portion $49_N$ of the negative busbar $4_N$. In addition, insert nuts 68c and 68d are embedded in the second major surface S2 of the mount base 6 such that the insert nuts 68c and 68d face the respective resistor connector portions $48_P$ and $48_N$ of the busbars $4_P$ and $4_N$.

In addition, insert nuts 68e are also embedded in respective predetermined portions of the second major surface S2 of the mount base 6.

The bolts 69a, which are fitted through the respective capacitor connector portion $49_P$ of the positive busbar $4_P$, are threadably fastened into the respective insert nuts 68a and the mount base 6 while their respective heads are closer to the respective capacitor connector portion $49_P$ than to the mount base 6. Similarly, the bolts 69b, which are fitted through the respective capacitor connector portion $49_N$ of the negative busbar $4_N$, are threadably fastened into the respective insert nuts 68a and the mount base 6 while their respective heads are closer to the respective capacitor connector portion $49_N$ than to the mount base 6.

In addition, the bolt 69c, which is fitted through the second end 510b of the wire $51_P$ and the resistor connector portion $48_P$ of the positive busbar $4_P$, is threadably fastened into the insert nut 68c and the mount base 6 while its head is closer to the resistor connector portion $48_P$ than to the mount base 6. Similarly, the bolt 69d, which is fitted through the second end 510d of the wire $51_N$ and the resistor connector portion $48_N$ of the negative busbar $4_N$, is threadably fastened into the insert nut 68d and the mount base 6 while its head is closer to the resistor connector portion $48_N$ than to the mount base 6.

As illustrated in FIG. 3, through holes are formed through the respective positive and negative busbars $4_P$ and $4_N$ such that they are aligned to the respective insert nuts 68e. Bolts 69e, which are fitted through the respective through holes, are threadably fastened into the respective insert nuts 68e and the mount base 6 while their heads are closer to the corresponding positive and negative busbars $4_P$ and $4_N$ than to the mount base 6.

Referring to FIG. 7, the discharge resistor 5 has a first major surface S11 and a second major surface opposite to the first major surface S11, and has a first end 570 and a second end 580 opposite to the first end 570 in the X direction; the second end 580 is farther to the resistor connector portions $48_P$ and $48_N$ than first end 570 is.

As described above, the discharge resistor 5 is mounted at its second major surface on the bracket 52, and the bracket 52 is mounted on the first major surface S1 of the mount base 6.

The first end 510a of the wire $51_P$ is mounted to a first connector portion $59_P$ formed on the first major surface S11 of the first end 570 of the discharge resistor 5. The first connector portion $59_P$ is electrically connected to the discharge resistor 5, resulting in the discharge resistor 5 being electrically connected to the positive busbar $4_P$ via the wire $51_P$. Similarly, the first end 510c of the wire $51_N$ is mounted to a second connector portion $59_N$ formed on the first major surface S11 of the second end 580 of the discharge resistor 5. The second connector portion $59_N$ is electrically connected to the discharge resistor 5, resulting in the discharge resistor 5 being electrically connected to the negative busbar $4_N$ via the wire $51_N$.

Because each of the wires $51_P$ and $51_N$ has a sufficiently small diameter, each of the wires $51_P$ and $51_N$ enables heat transferred through the corresponding one of the wires $51_P$ and $51_N$ to be efficiently dissipated through the corresponding wire.

This connection configuration between the discharge resistor 5 and the positive and negative busbars $4_P$ and $4_N$ enables a component of heat generated from the discharge resistor 5 by the heat conduction to be dissipated through the wires $51_P$ and $51_N$.

In addition, because the second end 580 is farther to the resistor connector portions $48_P$ and $48_N$ than first end 570 is, the length of the wire $51_N$ connecting between the second connector portion $59_N$ and the resistor connector portion $48_N$ is longer than the length of the wire $51_P$ connecting between the first connector portion $59_P$ and the resistor connector portion $48_P$ (see FIG. 4). This enables heat generated by the discharge resistor 5 to be dissipated while the heat is transferred through the wire $51_N$ more efficiency than the heat while the heat is transferred through the wire $51_P$.

The bracket 52 includes holding hooks 521 projecting from longer sides thereof; the holding hooks 521 fixedly grasps the discharge resistor 5 mounted on the first major surface of the bracket 52.

Next, the following describes how the power converter 1 is operated. Referring to FIGS. 1 and 2, the power converter 1 is configured such that the pair of DC busbars $4_P$ and $4_N$ is interposed between the discharge resistor 5 and the smoothing capacitor module 3. This configuration enables the pair of DC busbars $4_P$ and $4_N$ to shield, i.e. protect, the smoothing capacitor module 3 from both a component of heat transferred from the discharge resistor 5 by heat convection and a component of heat transferred from the discharge resistor 5 by radiation. This enables an increase of the temperature of the smoothing capacitor module to be curbed.

In particular, the power converter 1 is configured such that the two DC busbars $4_P$ and $4_N$ are arranged between the discharge resistor 5 and the smoothing capacitor module 3 instead of a single DC busbar arranged therebetween. The two DC busbars $4_P$ and $4_N$ therefore more efficiently shield the smoothing capacitor module 3 from both a component of heat transferred from the discharge resistor 5 by heat convection and a component of heat transferred from the discharge resistor 5 by radiation.

The discharge resistor 5 of the power converter 1 is electrically connected to the smoothing capacitor module 3 via the pair of DC busbars $4_P$ and $4_N$. This configuration results in reduction of heat transferred from the discharge resistor 5 to the smoothing capacitor module 3 by the heat conduction.

Specifically, because each of the DC busbars $4_P$ and $4_N$ is made of a metallic material and has a substantially rectangular plate-like shape, each of the DC busbars $4_P$ and $4_N$ has a relatively high heat capacity. For this reason, when heat generated from the discharge resistor 5 is transferred to the DC busbars $4_P$ and $4_N$, first, the temperature of each of the DC busbars $4_P$ and $4_N$ is prevented from rising, preventing heat from being transferred from the DC busbars $4_P$ and $4_N$ to the smoothing capacitor module 3. This therefore restricts high heat transfer based on the heat conduction from the discharge resistor 5 to the smoothing capacitor module 3 via the DC busbars $4_P$ and $4_N$.

To sum up, the pair of DC busbars $4_P$ and $4_N$ of the power converter 1 according to the first embodiment is capable of (1) Shielding the smoothing capacitor module 3 from both heat transferred from the discharge resistor 5 by heat convection and heat transferred from the discharge resistor 5 by radiation (2) Restricting high heat transfer based on the heat conduction from the discharge resistor 5 to the smoothing capacitor module 3

This therefore results in efficient restriction of the temperature rise of the smoothing capacitor module 3.

Additionally, the DC busbars $4_P$ and $4_N$ are arranged to face each other with a predetermined space therebetween in the Z direction in which the discharge resistor 5 and the smoothing capacitor module 3 are arranged to face each other. That is, as illustrated in FIG. 9, the direction of a direct current supplied from the positive terminal of the DC power source 1 and flowing through the positive busbar $4_P$ is substantially opposite to the direction of a direct current flowing through the negative busbar $4_N$ to the negative terminal of the DC power source 1. This configuration therefore enables a magnetic field generated by the direct current flowing through the positive busbar $4_P$ and a magnetic field generated by the direct current flowing through the negative busbar $4_N$ to cancel each other out. This therefore results in reduction of parasitic inductance in each of the DC busbars $4_P$ and $4_N$, making it possible to prevent a high surge from being generated from the power converter 1 due to the parasitic inductance when at least one of the semiconductor switching elements 20 is switched from one of on and off states to the other thereof.

In particular, the insulator member 41 is sandwiched between the DC busbars $4_P$ and $4_N$ to constitute the stack configuration of the positive busbar $4_P$, the insulator member 41, and the negative busbar $4_N$; the stack configuration of the positive busbar $4_P$, the insulator member 41, and the negative busbar $4_N$ is interposed between the discharge resistor 5 and the smoothing capacitor module 3.

This configuration enables the stack configuration of the positive busbar $4_P$, the insulator member 41, and the negative busbar $4_N$ to more efficiently shield the smoothing capacitor module 3 from both heat transferred from the discharge resistor 5 by heat convection and a component of heat transferred from the discharge resistor 5 by radiation. In addition, the insulator member 41 interposed between the positive and negative busbars $4_P$ and $4_N$ enables the positive and negative busbars $4_P$ and $4_N$ to be as close as possible to each other while electrically isolating the positive and negative busbars $4_P$ and $4_N$ from each other. This configuration results in further reduction of parasitic inductance in each of the DC busbars $4_P$ and $4_N$, making it possible to further prevent a high surge from being generated from the power converter 1 due to the parasitic inductance when at least one of the semiconductor switching elements 20 is switched from one of on and off states to the other thereof.

The power converter 1 according to the first embodiment is configured such that (1) The smoothing capacitor module 3 and the DC busbars $4_P$ and $4_N$ are respectively provided as discrete components being unintegrated with each other (2) The positive and negative terminals $32_P$ and $32_N$ of the smoothing capacitor module 3 are fastened to the respective DC busbars $4_P$ and $4_N$ This configuration makes it possible to reduce both heat transferred from the discharge resistor 5 by heat convection and a component of heat transferred from the discharge resistor 5 by radiation more effectively than a conventional power converter in which the smoothing capacitor module 3 and the DC busbars $4_P$ and $4_N$ are integrated with each other.

Specifically, as described later, the smoothing capacitor module 3 and the DC busbars $4_P$ and $4_N$ can be integrated with each other (see FIG. 11). This modified power converter results in smaller heat resistance between the positive and negative terminals $32_P$ and $32_N$ of the smoothing capacitor module 3 and the respective DC busbars $4_P$ and $4_N$. This may therefore result in heat, which has been transferred from the discharge resistor 5 to the DC busbars $4_P$ and $4_N$, being easily further transferred to the positive and negative terminals $32_P$ and $32_N$.

In contrast, the power converter 1 is configured such that the smoothing capacitor module 3 and the DC busbars $4_P$ and $4_N$ are individually provided, and the positive and negative terminals $32_P$ and $32_N$ of the smoothing capacitor module 3 are fastened to the respective DC busbars $4_P$ and $4_N$. This configuration enables the interfacial thermal resistance between each of the positive and negative terminals $32_P$ and $32_N$ of the smoothing capacitor module 3 and the corresponding one of the DC busbars $4_P$ and $4_N$ to become higher, reducing further transfer of heat, which has been transferred from the discharge resistor 5 to the DC busbars $4_P$ and $4_N$, to the positive and negative terminals $32_P$ and $32_N$. This therefore results in further efficient restriction of the temperature rise of the smoothing capacitor module 3.

As illustrated in FIGS. 1 and 2, the power converter 1 according to the first embodiment includes the mount base 6 to which the positive and negative busbars $4_P$ and $4_N$ are mounted. The mount base 6 is interposed between the discharge resistor 5 and the positive and negative busbars $4_P$ and $4_N$. This configuration results in shielding of the smoothing capacitor module 3 from both heat transferred from the discharge resistor 5 by heat convection and a component of heat transferred from the discharge resistor 5 by radiation, making it possible to efficiently restrict the temperature rise of the smoothing capacitor module 3.

The discharge resistor 5 of the power converter 1 is fixedly mounted to the mount base 6 in addition to the positive and negative busbars 4P and 4N being mounted to the mount base 6. This configuration eliminates the need of providing different mount members to which the discharge resistor 5 and the positive and negative busbars 4P and 4N are to be mounted. This results in reduction of the number of components that constitute the power converter 1, resulting in the size of the power converter 1 being smaller.

Additionally, the metallic bracket 52 is interposed between the mount base 6 and the discharge resistor 5 and configured to mount the discharge resistor 5 to the mount base 6. This configuration therefore further shields the smoothing capacitor module 3 from both heat transferred from the discharge resistor 5 by heat convection and a component of heat transferred from the discharge resistor 5 by radiation, making it possible to further efficiently restrict the temperature rise of the smoothing capacitor module 3.

The power converter 1 according to the first embodiment is configured such that the positive terminals $32_P$ and the negative terminals $32_N$ of the smoothing capacitor module 3 fixedly support the assembly comprised of the mount base 6, the positive and negative busbars $4_P$ and $4_N$, and the discharge resistor 5. This configuration eliminates the need of providing different support members for supporting the mount base 6, the positive and negative busbars $4_P$ and $4_N$, and the discharge resistor 5. This results in reduction of the number of components that constitute the power converter 1, resulting in the size of the power converter 1 being smaller.

The power converter 1 according to the first embodiment includes the cooling mechanism 11 that cools the semiconductor modules 2. Because the DC busbars $4_P$ and $4_N$ are connected to the respective semiconductor modules 2, cooling the semiconductor modules 2 enables the temperature of each of the DC busbars $4_P$ and $4_N$ to decrease, reducing heat transfer from the DC busbars $4_P$ and $4_N$ to the smoothing capacitor module 3. This results in even more efficient restriction of the temperature rise of the smoothing capacitor module 3.

Additionally, as illustrated in FIG. 1, the first ends 12a of the cooling pipes 12 are arranged to be adjacent to the discharge resistor 5 in the Y direction. In addition, the DC busbars $4_P$ and $4_N$ substantially separate the internal space of the housing 7 into a first space 7S1 in which the discharge resistor 5 is disposed, and a second space 7S2 in which the smoothing capacitor module 3 is disposed. The cooling mechanism 11 is located in the first space 7S1. In particular, the first ends 12a of the cooling pipes 12 are closer to the discharge resistance 5 than to the smoothing capacitor module 3 in the Z direction.

This configuration enables the first ends 12a of the cooling pipes 12 to efficiently cool the discharge resistor 5, thus reducing heat transferred from the discharge resistor 5 to the smoothing capacitor module 3. This results in still further efficient restriction of the temperature rise of the smoothing capacitor module 3.

The power converter 1 includes the metallic housing 7 that houses the semiconductor-module assembly 100, the smoothing capacitor module 3, the DC busbars 4, the discharge resistor 5, the mount base 6, and the control circuit board 14. In particular, a part of the cooling mechanism 11 is in thermal contact with the housing 7. Note that the expression that "A is in thermal contact with B" means that A is directly in contact with B or A is in indirect contact with B via a medium that has a thermal conductivity higher than the thermal conductivity of air.

In particular, the discharge resistor 5 is surrounded by the sidewalls 7c and 7f of the housing 7, the first attachment wall $70_{f1}$ of the housing 7, and the first ends 12a of the cooling pipes 12 of the cooling mechanism 11. This configuration enables the discharge resistor 5 to be efficiently cooled. Specifically, because the housing 7 is in thermal contact with the cooling pipe 12C2 of the cooling mechanism 11, the cooling mechanism 11 cools the housing 7. This makes it possible for the cooled housing 7 and the cooling pipes 12 of the cooling mechanism 11 that surround the discharge resistor 5 to efficiently cool the discharge resistor 5, and results in even more efficient restriction of the temperature rise of the smoothing capacitor module 3.

The power converter 1 according to the first embodiment is configured such that the wire $51_P$ electrically connects between the discharge resistor 5 and the positive busbar $4_P$, and the wire $51_N$ electrically connects between the discharge resistor 5 and the negative busbar $4_N$.

This configuration enables heat transferred through each of the wires $51_P$ and $51_N$ to be efficiently dissipated from the corresponding wire, resulting in reduction of heat transfer from each of the DC busbars $4_P$ and $4_N$ to the smoothing capacitor module 3 via the corresponding one of the wires $51_P$ and $51_N$, resulting in efficient heat transfer restriction from the discharge resistor 5 to the smoothing capacitor 5 via the corresponding one of the wires $51_P$ and $51_N$. This therefore restricts higher heat transfer based on the heat conduction from the discharge resistor 5 to the smoothing capacitor module 3 via the DC busbars $4_P$ and $4_N$, resulting in additional efficient restriction of the temperature rise of the smoothing capacitor module 3.

The discharge resistor 5 is located above the DC busbars $4_P$ and $4_N$ in an upper direction that is opposite to the direction of gravitational force, and the smoothing capacitor module 3 is located below the DC busbars $4_P$ and $4_N$ in the direction of gravitational force. Air warmed by heat discharged from the discharge resistor 5 conventionally flows upward opposite to the direction of gravitational force.

That is, arranging the smoothing capacitor module 3 below the DC busbars $4_P$ and $4_N$ in the direction of gravitational force prevents air warmed by the heat discharged from the discharge resistor 5 from flowing toward the smoothing capacitor module 3, resulting in efficient restriction of the temperature rise of the smoothing capacitor module 3.

The configuration that the mount base 6 is fixed to the housing 7 enables heat generated from the discharge resistor 5 to be efficiently transferred to the outside of the housing 7 through the mount base 6 and the housing 7.

Second Embodiment

Figure 10:
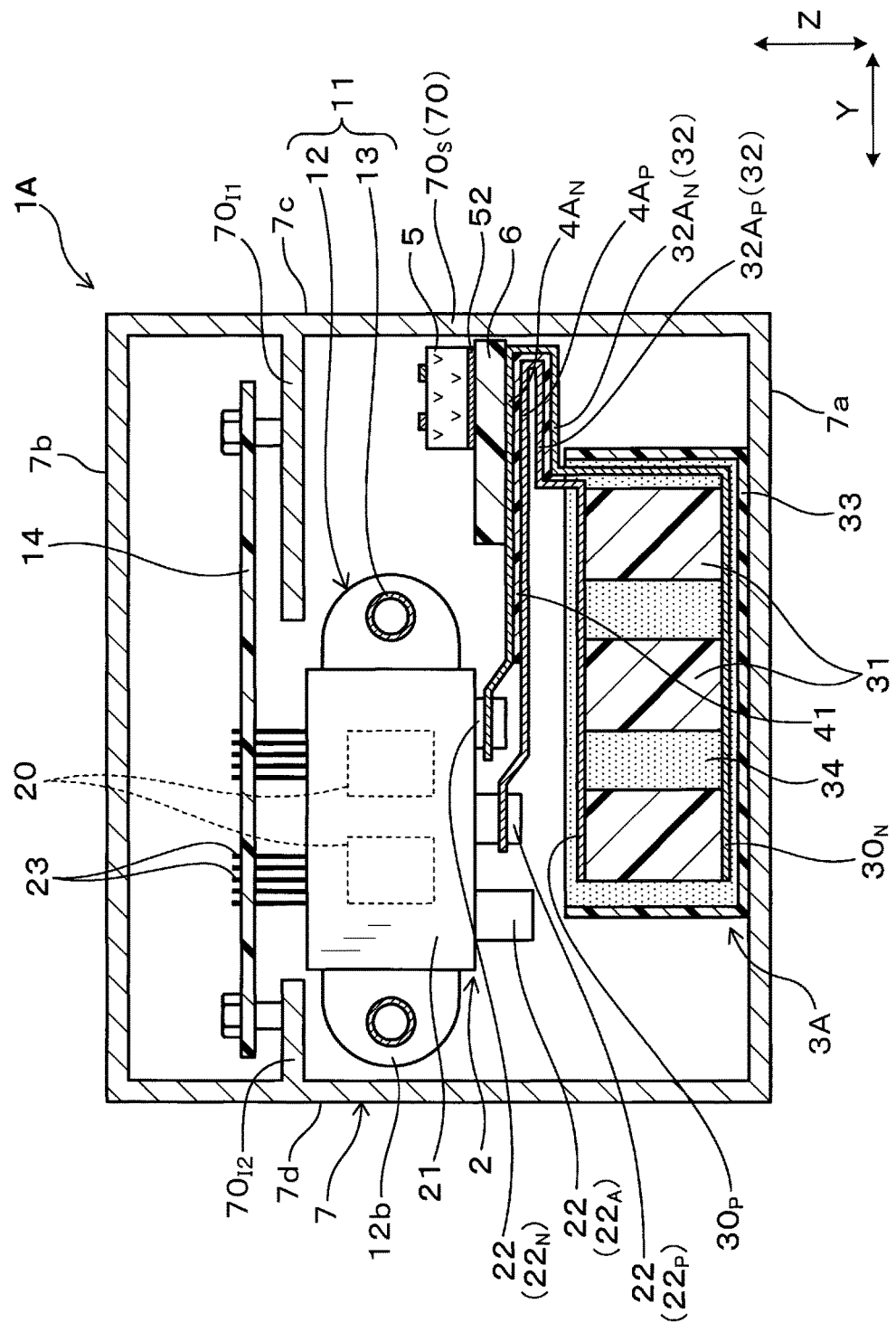
FIG. 10 is a cross-sectional view of a power converter according to the second embodiment of the present disclosure, which corresponds to FIG. 1.
Figure 11:
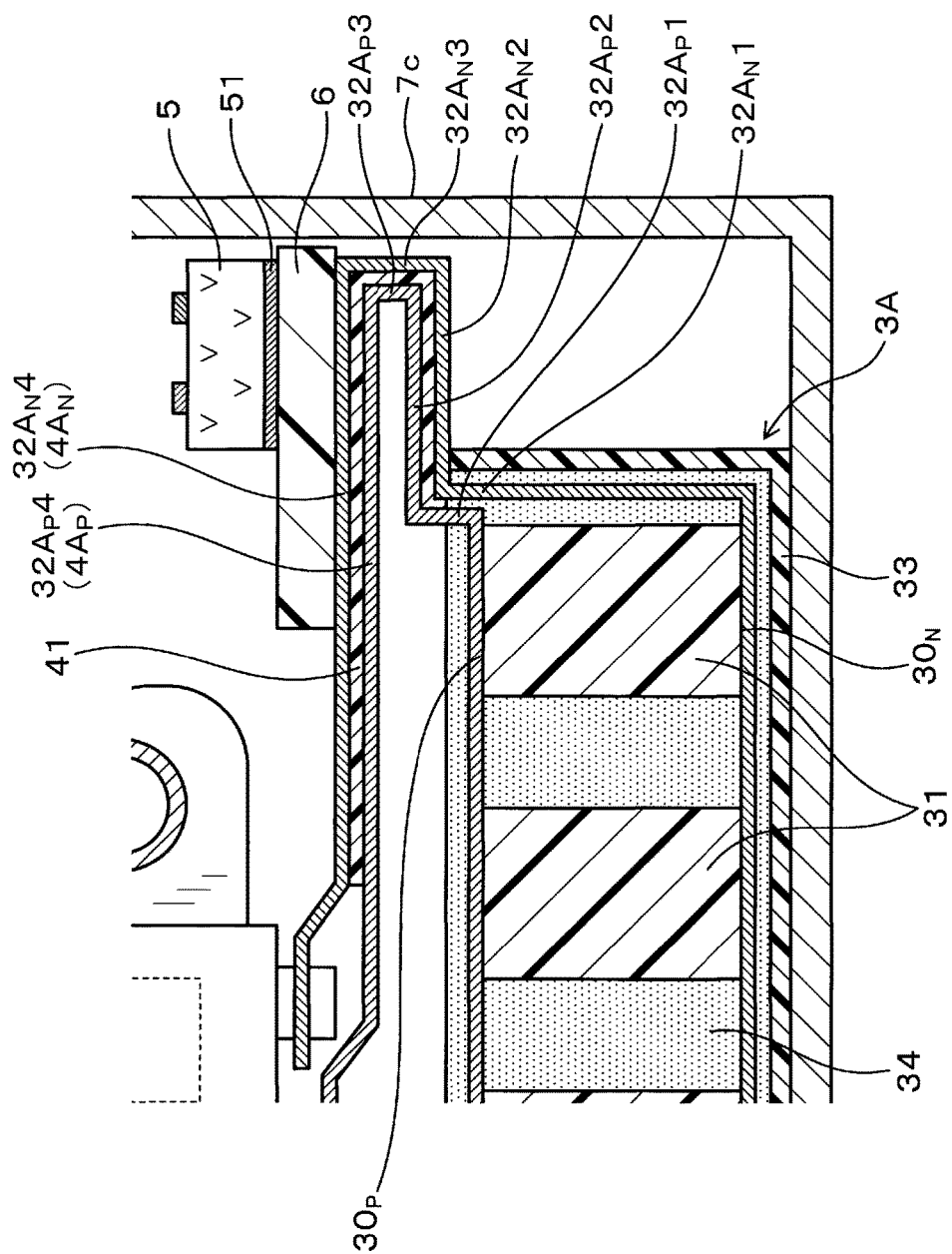
FIG. 11 is an enlarged view of principal components of the power converter illustrated in FIG. 10.

The following describes a power converter 1A according to the second embodiment of the present disclosure with reference to FIGS. 10 and 11. The configuration and functions of the power converter 1A according to the second embodiment are mainly different from those of the power converter 1 according to the first embodiment by the following points. The following therefore mainly describes the different points.

A smoothing capacitor module 3A and positive and negative busbars $4A_P$ and $4A_N$ are integrally formed.

The smoothing capacitor module 3A is comprised of the common positive electrode $30_P$, the common negative electrode $30_N$, the capacitor cells 31, a plate-like positive terminal $32A_P$, a plate-like negative terminal $32A_N$, the substantially rectangular-parallelepiped case 33, and the filler member 34, which are substantially identical to the corresponding respective components of the smoothing capacitor module 3.

In particular, the positive terminal $32A_P$ has opposing first and second ends in its longitudinal direction, and the first end of the positive terminal $32A_P$ is joined to the first side of the common positive electrode $30_P$ in the filler member 34. Similarly, the negative terminals $32A_N$ have opposing first and second ends in its longitudinal direction, and the first end of the negative terminal $32A_N$ is joined to the first side of the common negative electrode $30_N$ in the filler member 34.

The positive terminal $32A_P$ whose first end is joined to the first side of the common positive electrode $30_P$ is partially exposed from the filler member 34 via the opening top wall of the case 33. Similarly, the negative terminal $32A_N$ whose first end is joined to the common negative electrode $30_N$ in the filler member 34 is partially exposed from the filler member 34 via the opening top wall of the case 33.

The exposed portion of the positive terminal $32A_P$ is comprised of (1) A portion $32A_P1$ extending toward the top wall 7b by a predetermined length in the Z direction (2) A portion $32A_P2$ continuously bent to extend toward the sidewall 7c of the housing 7 by a predetermined length in the Y direction (3) A portion $32A_P3$ continuously bent to extend toward the top wall 7b by a predetermined length in the Z direction (4) A portion $32A_P4$ continuously bent to extend toward the sidewall 7d by a predetermined length in the Y direction; the portion $32A_P4$ constitutes the positive busbar $4A_P$ that is structurally and functionally identical to the positive busbar $4_P$ Additionally, the exposed portion of the negative terminal $32A_N$ is comprised of (1) A portion $32A_N1$ extending toward the top wall 7b by a predetermined length in the Z direction (2) A portion $32A_N2$ continuously bent to extend toward the sidewall 7c of the housing 7 by a predetermined length in the Y direction (3) A portion $32A_N3$ continuously bent to extend toward the top wall 7b by a predetermined length in the Z direction (4) A portion $32A_N4$ continuously bent to extend toward the sidewall 7d by a predetermined length in the Y direction; the portion $32A_N4$ constitutes the negative busbar $4A_N$ that is structurally and functionally identical to the negative busbar $4_N$ Specifically, the power converter 1A is configured such that the smoothing capacitor module 3A and the positive and negative busbars $4A_P$ and $4A_N$ are integrally formed. This configuration therefore results in reduction of the number of components that constitute the power converter 1A, resulting in the manufacturing cost of the power converter 1A decreasing.

The power converter 1A also obtains the same benefits as the benefits obtained by the power converter 1 set forth above.

The functions of one element in each embodiment can be distributed as plural elements, and the functions that plural elements have can be combined into one element. At least part of the structure of each embodiment can be replaced with a known structure having the same function as the at least part of the structure of the corresponding embodiment. A part of the structure of each embodiment can be eliminated. At least part of the structure of each embodiment can be added to or replaced with at least part of the structure of the other embodiment.

All aspects included in the technological ideas specified by the language employed by the claims constitute embodiments of the present invention.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alterations as would be appreciated by those having ordinary skill in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A power converter comprising:
a semiconductor module incorporating therein a semiconductor element constituting a power converter circuit;
a smoothing capacitor configured to smooth a direct-current voltage applied to the semiconductor module;
a pair of positive and negative busbars configured to electrically connect the semiconductor module and the smoothing capacitor, the positive and negative busbars being arranged to face each other with a predetermined space therebetween; and
a discharge resistor connected in parallel with the smoothing capacitor via the positive and negative busbars and configured such that an electrical charge stored in the smoothing capacitor flows through the discharge resistor as a discharge current,
the positive and negative busbars being interposed between the discharge resistor and the smoothing capacitor, wherein:
the smoothing capacitor comprises positive and negative terminals;
the positive busbar is fastened to the positive terminal of the smoothing capacitor;
the negative busbar is fastened to the negative terminal of the smoothing capacitor; and
the positive and negative terminals of the smoothing capacitor are configured to support the positive and negative busbars and the discharge resistor.

2. The power converter according to claim 1, further comprising:
an insulator member interposed between the positive and negative busbars.

3. The power converter according to claim 1, wherein:
the smoothing capacitor is provided as a discrete component being unintegrated with the positive and negative busbars; and
the smoothing capacitor includes a pair of positive and negative terminals that are fastened to the respective positive and negative busbars.

4. The power converter according to claim 1, further comprising:
a mount base to which the positive and negative busbars are mounted,
wherein the mount base is interposed between the discharge resistor and the positive and negative busbars.

5. The power converter according to claim 4, wherein:
the discharge resistor is mounted to the mount base.

6. The power converter according to claim 1, further comprising:
a cooling mechanism arranged to cool the semiconductor module.

7. The power converter according to claim 6, wherein:
each of the positive and negative busbars has a thickness;
the cooling mechanism is arranged such that at least a part of the cooling mechanism is adjacent to the discharge resistor and is closer to the discharge resistor than to the capacitor in a direction of the thickness of each of the positive and negative busbars; and
the cooling mechanism is configured such that a coolant flows through at least the part of the cooling mechanism.

8. The power converter according to claim 1, further comprising:
a metallic housing that houses the semiconductor module, the cooling mechanism, the discharge resistor, the smoothing capacitor, and the positive and negative busbars,
wherein:
the housing is comprised of a plurality of walls;
at least one of the walls of the housing is in thermal contact with the cooling mechanism; and
the discharge resistor is arranged to be sandwiched between the cooling mechanism and at least one of the walls of the housing.

9. The power converter according to claim 6, wherein:
the positive and negative busbars and the discharge resistor are mounted to the mount base so as to constitute an assembly; and
the positive and negative terminals of the smoothing capacitor are configured to fixedly support the assembly of the positive and negative busbars, the discharge resistor, and the mount base.

10. The power converter according to claim 6, further comprising:

a metallic bracket interposed between the mount base and the discharge resistor and configured to mount the discharge resistor to the mount base.

11. The power converter according to claim 1, further comprising:
a pair of wires that electrically connect the discharge resistor and the respective positive and negative busbars.

12. The power converter according to claim 1, wherein:
the discharge resistor is located above the positive and negative busbars in a direction opposite to a direction of gravitational force; and
the smoothing capacitor is located below the positive and negative busbars in the direction of gravitational force.

* * * * *